(12) United States Patent
Otsubo (10) Patent No.: US 9,590,417 B2
(45) Date of Patent: Mar. 7, 2017

(54) ESD PROTECTIVE DEVICE (71) Applicant: Murata Manufacturing Co., Ltd., Kyoto-fu (JP)

(72) Inventor: Yoshihito Otsubo, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 279 days.

(21) Appl. No.: 14/267,483

(22) Filed: May 1, 2014

(65) Prior Publication Data

US 2014/0240878 A1 Aug. 28, 2014

Related U.S. Application Data

(63) Continuation of application No. PCT/JP2012/078009, filed on Oct. 30, 2012.

(30) Foreign Application Priority Data

Nov. 1, 2011 (JP) ................. 2011-239961

(51) Int. Cl.
*H02H 1/00* (2006.01)
*H02H 9/04* (2006.01)
*H01T 4/12* (2006.01)
*H05K 9/00* (2006.01)
*H05K 1/02* (2006.01)

(52) U.S. Cl.
CPC ............ *H02H 9/04* (2013.01); *H01T 4/12* (2013.01); *H02H 9/044* (2013.01); *H05K 1/0259* (2013.01); *H05K 9/0067* (2013.01); *H05K 9/0079* (2013.01)

(58) Field of Classification Search
USPC .................... 361/56, 112, 212, 220
See application file for complete search history.

(56) References Cited

U.S. PATENT DOCUMENTS 8,238,069 B2 * 8/2012 Adachi ............... H01T 1/20
361/212
2011/0222197 A1 * 9/2011 Adachi ............... H01T 4/12
361/56

FOREIGN PATENT DOCUMENTS

JP 2003-123936 A 4/2003
JP 2008-146514 A 6/2008
(Continued)

OTHER PUBLICATIONS

International Search Report for Application No. PCT/JP2012/078009 dated Dec. 4, 2012.
(Continued)

*Primary Examiner* — Danny Nguyen
(74) *Attorney, Agent, or Firm* — Pearne & Gordon LLP (57) ABSTRACT

Inside an insulating multilayer substrate 12 in which a plurality of insulating layers are laminated, a cavity portion 13, at least one pair of discharge electrodes 14 and 15, and conductor portions 34 and 35 are formed. The discharge electrodes 14 and 15 are connected to external electrodes 18 and 19 and have facing portions 14a and 15a which are formed along an inner surface of the cavity portion 13 and which face each other with a space provided therebetween. The conductor portions 34 and 35 are formed to cover at least one of facing front ends 14s and 15s of the facing portions 14a and 15a of the discharge electrodes 14 and 15 when viewed in a lamination direction of the insulating layers, a facing direction of the facing portions 14a and 15a, or a direction perpendicular both to the lamination direction and the facing direction.

12 Claims, 6 Drawing Sheets

(56) References Cited

FOREIGN PATENT DOCUMENTS

| | | |
|---|---|---|
| JP | 2009-016616 A | 1/2009 |
| WO | 2009/136535 A1 | 11/2009 |
| WO | 2011/040435 A1 | 4/2011 |

OTHER PUBLICATIONS

Written Opinion of the International Search Authority for Application No. PCT/JP2012/078009 dated Dec. 4, 2012.

* cited by examiner

ESD PROTECTIVE DEVICE

BACKGROUND OF THE INVENTION

Field of the Invention

The present invention relates to an ESD protective device and more particularly, relates to an ESD protective device in which discharge is generated between facing portions of discharge electrodes, the facing portions being exposed in a cavity portion formed inside a ceramic multilayer substrate.

Description of the Related Art

ESD (Electro-Static Discharge) indicates a phenomenon in which intense discharge is generated when a charged conductive object (such as a human body) is brought into contact with or is placed sufficiently close to another conductive object (such as an electronic apparatus). When ESD is generated, problems, such as damage to and malfunction of electronic apparatuses, may arise. In order to prevent the generation of ESD, it is necessary to prevent an excessive voltage generated in discharge from being applied to a circuit of an electronic apparatus. An ESD protective device is a device used for the application as described above and is also called a surge absorbing element or a surge absorber.

The ESD protective device is disposed, for example, between a signal line of a circuit and the ground (earth). Since having the structure in which a pair of discharge electrodes is disposed with a space provided therebetween, the ESD protective device has a high resistance in a normal usage state, and hence, a signal is not allowed to flow to a ground side. On the other hand, when an excessive voltage is applied, such as the case in which a static charge is applied from an antenna of a mobile phone or the like, discharge is generated between the discharge electrodes of the ESD protective device, and as a result, the static charge can be guided to the ground side. By this flow of the static charge, the voltage caused by the static charge is not applied to circuits provided at the downstream side of the ESD protective device, and hence the circuits can be protected.

Figure 12:
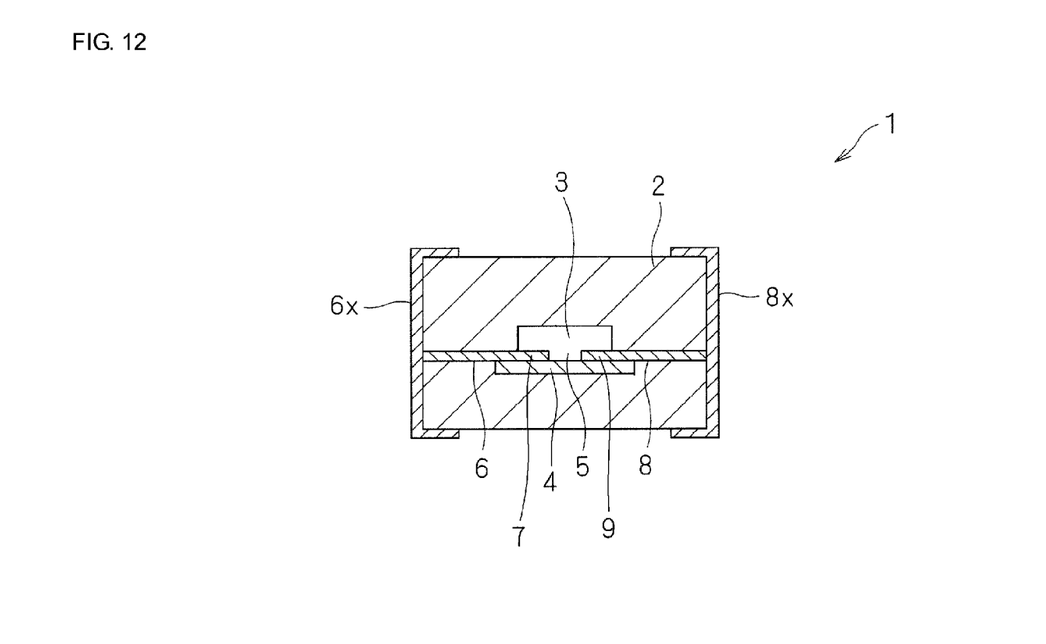
FIG. 12 is an important part cross-sectional view of an ESD protective device (Related Example).

For example, in an ESD protective device 1 shown in a cross-sectional view of FIG. 12, a cavity portion 3 and discharge electrodes 6 and 8 facing each other with a space 5 provided therebetween are formed inside a ceramic multilayer substrate 2. The discharge electrodes 6 and 8 include facing portions 7 and 9, respectively, which are formed along an inner surface of the cavity 3. The discharge electrodes 6 and 8 extend from the cavity portion 3 to peripheral surfaces of the ceramic multilayer substrate 2 and are connected to external electrodes 6x and 8x, respectively, which are formed outside the ceramic multilayer substrate 2, that is, which are formed on surfaces of the ceramic multilayer substrate 2. The external electrodes 6x and 8x are used to mount the ESD protective device 1. An auxiliary electrode 4 in which an electrically conductive material is dispersed is formed adjacent to the facing portions 7 and 9 of the discharge electrodes 6 and 8 and to a portion at which the space 5 between the facing portions 7 and 9 is formed.

When a voltage having a predetermined value or more is applied to the external electrodes 6x and 8x, discharge is generated between the facing portions 7 and 9 of the discharge electrodes 6 and 8, and an excessive voltage is guided to the ground by this discharge, so that a circuit provided at the downstream side can be protected. When the space 5 between the facing portions 7 and 9 of the discharge electrodes 6 and 8 and the amount and the type of electrically conductive material contained in the auxiliary electrode 4 are adjusted, a discharge starting voltage may be determined (for example, see Patent Document 1).

Patent Document 1: International Publication No. 2008/146514

BRIEF SUMMARY OF THE INVENTION

When discharge is repeatedly performed in the ESD protective device, because of heat and shock generated in discharge, the facing portions of the discharge electrodes may be melted or peeled away, and the gap between the facing portions of the discharge electrodes may be increased in some cases. As a result, the discharge starting voltage is increased, and thereby the discharge characteristics may be degraded in some cases.

Figure 11:
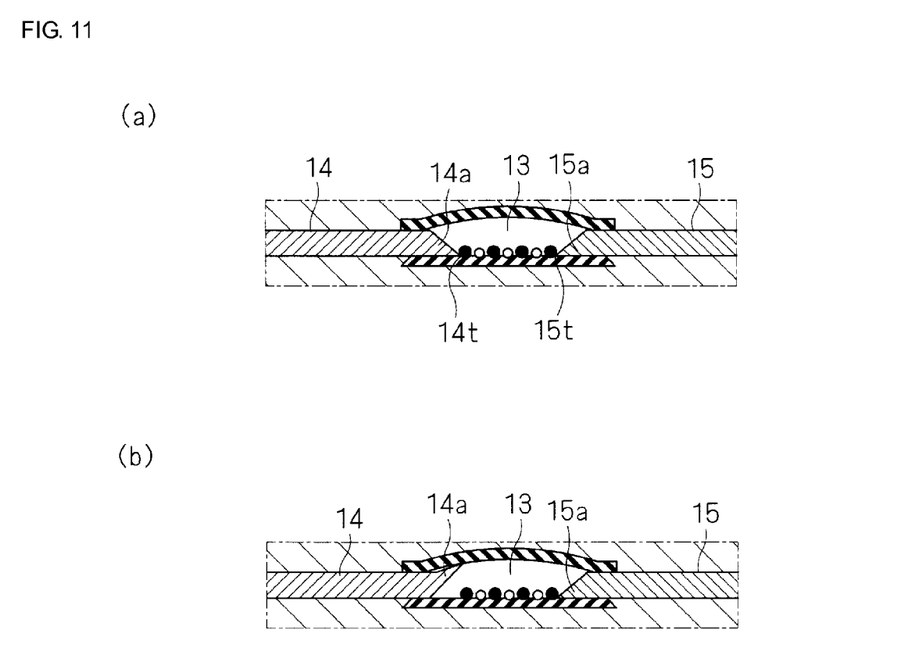
FIG. 11(a) is an important part cross-sectional view of an ESD protective device (Explanatory Example).
FIG. 11(b) is an important part cross-sectional view of an ESD protective device (Explanatory Example).

In particular, when the discharge electrodes are formed by printing of an electrically conductive paste, as shown in an important part cross-sectional view of FIG. 11(a), end portions of facing portions 14a and 15a of discharge electrodes 14 and 15 are formed thin in many cases, the facing portions 14a and 15a being formed along an inner surface of a cavity portion 13. When discharge is repeatedly performed, as shown in an important part cross-sectional view of FIG. 11(b), since the length of the facing portion 14a of the discharge electrode 14 which receives electrons may be shortened by peeling or melting, the gap between the facing portions 14a and 15a of the discharge electrodes 14 and 15 is liable to be increased; hence, the degradation in discharge characteristics becomes a more serious problem.

In addition, when a ceramic forming the ceramic multilayer substrate, which is a main body of the ESD protective device, contains a glass component, if the glass component is diffused to a front end portion, which is formed thin, of the facing portion of the discharge electrode during firing of the ESD protective device, sintering is excessively performed, and as a result, instead of forming an ideal state in which fine metal grains are densely dispersed, an over-sintered state is formed in which large metal grains are grown, and large voids are formed therebetween. In the facing portion of the discharge electrode in an over-sintered state, larger metal grains are further grown, and a so-called ball forming state is formed in which metal grains each having a ball shape are isolated from each other. As a result, since a discharge gap is practically increased, the discharge characteristics are liable to be degraded. As in the case described above, when the auxiliary electrode is placed in an over-sintered state due to the glass component, by the heat generated in discharge, the grains of the electrically conductive material are also grown, and the distance between the grains thereof is increased. As a result, since the effect of promoting the discharge is reduced, the discharge characteristics are liable to be degraded.

In consideration of the current situation described above, the present invention provides an ESD protective device which can suppress the degradation in discharge characteristics caused by repeatedly performed discharge.

In order to solve the problems described above, the present invention provides an ESD protective device which is configured as follows.

An ESD protective device comprises: a) an insulating multilayer substrate in which a plurality of insulating layers are laminated to each other; (b) a cavity portion formed inside the insulating multilayer substrate; (c) at least one pair of discharge electrodes having facing portions which are formed along an inner surface of the cavity portion and which face each other with a space provided therebetween; (d) external electrodes which are formed on surfaces of the insulating multilayer substrate and which are connected to the discharge electrodes; and (e) at least one conductor portion formed inside the ceramic multilayer substrate so as to cover at least one of facing front ends of the facing portions of the discharge electrodes when viewed in a lamination direction in which the insulating layers of the insulating multilayer substrate are laminated, a facing direction in which the facing portions of the discharge electrodes face each other, or a direction perpendicular both to the lamination direction and the facing direction.

In the structure described above, when a predetermined voltage or more is applied between the external electrodes, discharge is generated between the facing portions of the discharge electrodes facing each other, and heat is generated. The heat generated in discharge may be dissipated to a good electrical and thermal conductor portion.

According to the structure described above, even if discharge is repeatedly performed, an increase in temperature of the facing portions of the discharge electrodes can be suppressed. Hence, the increase in gap between the facing portions of the discharge electrodes caused by melting and/or peeling of the facing portions of the discharge electrodes, which occur by heat generated in discharge, is suppressed, and hence, the degradation in discharge characteristics can be suppressed.

When viewed in the lamination direction, the conductor portion is preferably formed so as to cover at least one of the facing front ends of the facing portions of the discharge electrodes. Between the conductor portion and the facing portions of the discharge electrodes, at least one of the insulating layers of the insulating multilayer substrate is disposed.

In this case, the conductor portion widely covers the facing portions of the discharge electrodes along the facing front ends of the facing portions of the discharge electrodes, has a wide area which faces the facing front ends of the facing portions of the discharge electrodes, and has an excellent effect of dissipating heat generated in discharge. Hence, the degradation in discharge characteristics can be more reliably suppressed.

The insulating multilayer substrate is preferably a ceramic multilayer substrate containing a glass component.

In this case, when the ESD protective device is fired, a glass component present at a side opposite to the facing portions of the discharge electrodes with respect to the conductor portion is prevented by the conductor portion from moving toward the facing portions of the discharge electrodes. Hence, the facing portions of the discharge electrodes are suppressed from being over-sintered caused by the glass component, and as a result, the degradation in discharge characteristics caused by over-sintering of the facing portions of the discharge electrodes can be suppressed.

A discharge auxiliary portion is preferably further provided which is formed in a facing region in which the front ends of the facing portions of the discharge electrodes face each other with the shortest distance provided therebetween and which contains dispersed metal material and semiconductor material. The conductor portion is formed so as to cover the facing region when viewed in the lamination direction.

When the metal material and the semiconductor material of the discharge auxiliary portion are disposed in a dispersed state in the facing region, since electrons are likely to move, a discharge phenomenon is effectively generated, and hence the discharge characteristics are stabilized. The conductor portion can effectively dissipate heat generated in the facing region in discharge. When the insulating multilayer substrate is a ceramic multilayer substrate containing a glass component, during firing of the ESD protective device, the glass component present at a side opposite to the discharge auxiliary portion with respect to the conductor portion is prevented by the conductor portion from moving toward the discharge auxiliary portion. As a result, since the discharge auxiliary portion is suppressed from being over-sintered caused by the glass component, the degradation in discharge characteristics caused by over-sintering of the discharge auxiliary portion can be suppressed.

The conductor portion is preferably disposed at a side opposite to the cavity portion in the lamination direction with respect to the facing portions of the discharge electrodes.

In this case, since the cavity portion is not provided between the conductor portion and the facing portions of the discharge electrodes, the conductor portion can be disposed closer to the facing portions of the discharge electrodes, so that heat dissipation can be more effectively performed. In addition, when the insulating multilayer substrate is a ceramic multilayer substrate containing a glass component, during firing of the ESD protective device, the diffusion of the glass component can be more effectively suppressed.

The conductor portions are preferably disposed at a plurality of different positions between the insulating layers of the insulating multilayer substrate.

In this case, since the conductor portions are provided at a plurality of positions, the heat dissipation and the diffusion suppression of the glass component can be more reliably performed.

The conductor portions are preferably disposed at two sides in the lamination direction with respect to the facing portions of the discharge electrodes.

In this case, since the conductor portions are disposed at two primary surface sides of the facing portions of the discharge electrodes, the heat dissipation and the diffusion suppression of the glass component can be more reliably performed.

The conductor portion is preferably electrically connected to at least one of the discharge electrodes.

In this case, since electricity and heat are well conducted between the conductor portion and the discharge electrode, heat can be dissipated out of the ESD protective device from the conductor portion through the discharge electrode and the external electrode, and hence the heat dissipation can be more reliably performed.

The ESD protective device preferably further comprises (f) an external conductor portion formed on a surface of the insulating multilayer substrate. The conductor portion and the external conductor portion are electrically connected to each other.

In this case, since electricity and heat are well conducted through the external conductor portion, and electricity and heat are also well conducted between the conductor portion and the external conductor portion, heat can be dissipated out of the ESD protective device from the conductor portion through the external conductor portion, and hence, the heat dissipation can be more reliably performed.

The ESD protective device preferably further comprises (g) a seal layer which is disposed between the facing portions of the discharge electrodes and the insulating layers of the insulating layer substrate and which suppresses a component contained in the insulating layers of the insulating layer substrate from passing therethrough.

In this case, since being suppressed from passing through the seal layer, the component contained in the insulating multilayer substrate is not likely to reach the facing portions of the discharge electrodes, and hence, the degradation in discharge characteristics caused by the influence of the component contained in the insulating multilayer substrate on the facing portions of the discharge electrodes can be suppressed. When the insulating multilayer substrate is a ceramic multilayer substrate containing a glass component, the degradation in discharge characteristics caused by over-sintering of the facing portions of the discharge electrodes and that of the discharge auxiliary portion due to the diffusion of the glass component can be suppressed.

Advantageous Effects of Invention

According to the present invention, the degradation in discharge characteristics caused by repeatedly performed discharge can be suppressed.

DETAILED DESCRIPTION OF THE INVENTION

Hereinafter, embodiments of the present invention will be described with reference to FIGS. 1 to 10.

Example 1-1

An ESD protective device 10 of Example 1-1 will be described with reference to FIGS. 1 and 2.

Figure 1:
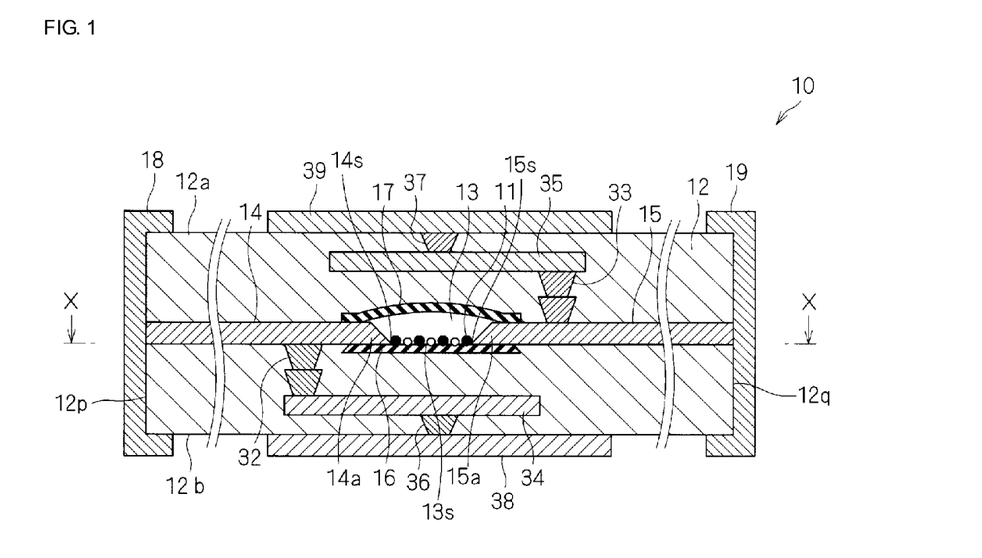
FIG. 1 is a cross-sectional view of an ESD protective device (Example 1-1).

FIG. 1 is a cross-sectional view of the ESD protective device 10. FIG. 2 is an important part cross-sectional view taken along the line X-X of FIG. 1.

Figure 2:
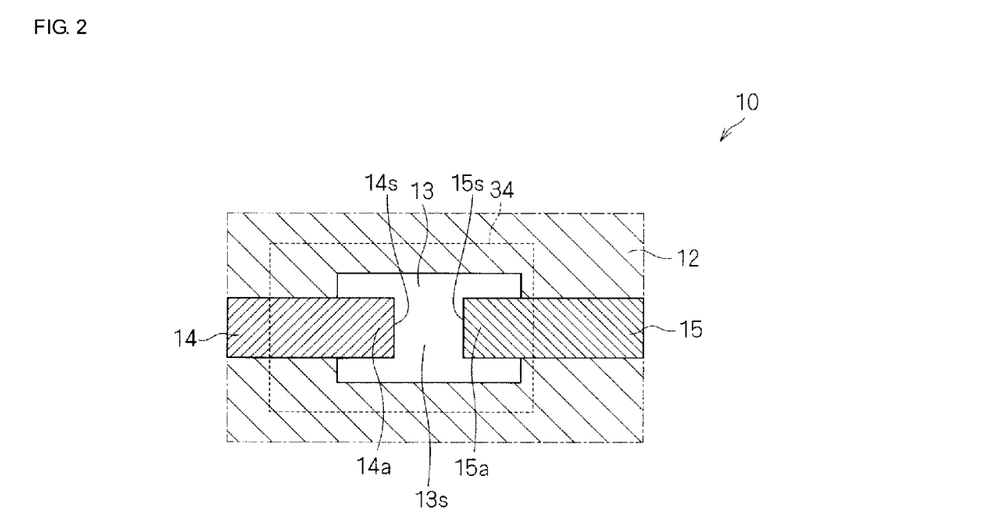
FIG. 2 is a cross-sectional view of the ESD protective device (Example 1-1).

As shown in FIGS. 1 and 2, the ESD protective device 10 includes a cavity portion 13 and a pair of discharge electrodes 14 and 15 which are formed in a ceramic multilayer substrate 12 in which a plurality of ceramic layers are laminated to each other in a top-to-bottom direction in FIG. 1. The discharge electrodes 14 and 15 includes facing portions 14a and 15a, respectively, which are formed along an inner surface of the cavity portion 13, which face each other with a space provided therebetween, and which are exposed in the cavity portion 13. External electrodes 18 and 19 are formed on end surfaces 12p and 12q, respectively, of the ceramic multilayer substrate 12 and are connected to the discharge electrodes 14 and 15, respectively. The external electrodes 18 and 19 are used to mount the ESD protective device 10 on a circuit board or the like.

Furthermore, inside the ceramic multilayer substrate 12, conductor portions 34 and 35 disposed between the ceramic layers of the ceramic multilayer substrate 12 and via conductors 32 and 33; and 36 and 37 penetrating the ceramic layers of the ceramic multilayer substrate 12 are formed. The conductor portions 34 and 35 are connected to the discharge electrodes 14 and 15 through the via conductors 32 and 33, respectively. The conductor portions 34 and 35, the via conductors 32 and 33, and the discharge electrodes 14 and 15 are good electrical and heat conductors, and the conductors 34 and 35 are electrically connected to the discharge electrodes 14 and 15, respectively.

When viewed in a lamination direction (in a top-to-bottom direction in FIG. 1) in which the ceramic layers of the ceramic multilayer substrate 12 are laminated, as shown in FIG. 2, the conductor portions 34 and 35 are formed so as to cover facing front ends 14s and 15s of the facing portions 14a and 15a of the discharge electrodes 14 and 15 and also so as to cover a facing region 13s in which the front ends 14s and 15s of the facing portions 14a and 15a of the discharge electrodes 14 and 15 face each other with the shortest distance provided therebetween.

External conductor portions 38 and 39 are formed on an upper surface 12a and a lower surface 12b of the ceramic multilayer substrate 12. The external conductor portions 38 and 39 are connected to the conductor portions 34 and 35 through the via conductors 36 and 37, respectively. The conductor portions 34 and 35, the via conductors 36 and 37, and the external conductor portions 38 and 39 are good electrical and thermal conductors, and the conductor portions 34 and 35 are electrically connected to the external conductor portions 38 and 39, respectively.

Between the ceramic multilayer substrate 12 and the cavity portion 13, seal layers 16 and 17 are formed. The seal layers 16 and 17 are formed, for example, of a ceramic having a sintering temperature higher than that of a ceramic forming the ceramic multilayer substrate 12. Since the seal layers 16 and 17 are provided, the diffusion of a glass component contained in the ceramic of the ceramic multilayer substrate 12 is prevented in sintering, and hence the facing portions 14a and 15a of the discharge electrodes 14 and 15 are suppressed from being over-sintered. In addition, the structure in which the seal layers 16 and 17 are not provided may also be formed.

As schematically shown by ● and ○ in FIG. 1, a discharge auxiliary portion 11 is formed on one seal layer 16 in the facing region 13s in which the front ends 14s and 15s of the facing portions 14a and 15a of the discharge electrodes 14 and 15 face each other with the shortest distance provided therebetween. The discharge auxiliary portion 11 contains dispersed metal material and semiconductor material. When the metal material and the semiconductor material of the discharge auxiliary portion 11 are disposed in a dispersed state in the facing region 13s in which electrons move in discharge, since electrons are likely to move, a discharge phenomenon is effectively generated, and hence, the discharge characteristics are stabilized.

In addition, the discharge auxiliary portion 11 may also be formed in a region adjacent to the facing region 13s. For example, the discharge auxiliary portion 11 may be formed on the facing portions 14a and 15a of the discharge electrodes 14 and 15, between the seal layer 16 and the facing portions 14a and 15a of the discharge electrodes 14 and 15, or the like.

In the ESD protective device 10, when a predetermined voltage or more is applied between the external electrodes 18 and 19, discharge is generated in the cavity portion 13, that is, between the facing portions 14a and 15a of the discharge electrodes 14 and 15. Heat generated in discharge is dissipated out of the ESD protective device 10 from the conductor portions 34 and 35 through the via conductors 36 and 37 and the external conductor portions 38 and 39 or is dissipated out of the ESD protective device 10 from the conductor portions 34 and 35 through the via conductors 32 and 33, the discharge electrodes 14 and 15, and the external electrodes 18 and 19. By the heat dissipation as described above, the increase in temperature of the facing portions 14a and 15a of the discharge electrodes 14 and 15 can be suppressed. Hence, the degradation in discharge characteristics can be suppressed, the degradation being caused, for example, by the increase in gap between the facing portions 14a and 15a of the discharge electrodes 14 and 15 due to melting and/or peeling of the facing portions 14a and 15a of the discharge electrodes 14 and 15 by repeatedly performed discharge, or by the practical increase in gap between the facing portions 14a and 15a of the discharge electrodes 14 and 15 due to a ball forming phenomenon.

In addition, when the ESD protective device 10 is fired, glass components present at sides opposite to the facing portions 14a and 15a of the discharge electrodes 14 and 15 with respect to the conductor portions 34 and 35 are prevented by the conductor portions 34 and 35 from moving toward the facing portions 14a and 15a of the discharge electrodes 14 and 15 and the discharge auxiliary portion 11. As a result, since the over-sintering of the facing portions 14a and 15a of the discharge electrodes 14 and 15 and the discharge auxiliary portion 11 caused by the glass component is suppressed, the degradation in discharge characteristics caused by the over-sintering of the facing portions 14a and 15a of the discharge electrodes 14 and 15 and the discharge auxiliary portion 11 can be suppressed.

Since the conductor portions 34 and 35 are provided at a plurality of positions, that is, at two sides in the lamination direction of the ceramic layers of the ceramic multilayer substrate 12 with respect to the facing portions 14a and 15a of the discharge electrodes 14 and 15, the heat dissipation and the diffusion suppression of the glass component can be more reliably performed.

The conductor portions 34 and 35 are formed along the facing front ends 14s and 15s of the facing portions 14a and 15a of the discharge electrodes 14 and 15 so as to widely cover the facing portions 14a and 15a of the discharge electrodes 14 and 15, and when viewed in the lamination direction, the conductor portions 34 and 35 are formed so as to cover the facing region 13s. Since the conductor portions 34 and 35 each have a large area facing the facing front ends 14s and 15s of the facing portions 14a and 15a of the discharge electrodes 14 and 15 and an excellent effect of dissipating heat generated in discharge, the degradation in discharge characteristics can be more reliably suppressed.

Example 1-2

An ESD protective device 10a of Example 1-2 will be described with reference to FIG. 3.

The ESD protective device 10a of Example 1-2 is formed in a manner approximately similar to that of the ESD protective device 10 of Example 1-1. Hereinafter, the same constituent elements are designated by the same reference numerals as described above, and the points different from those of Example 1-1 will be mainly described.

Figure 3:
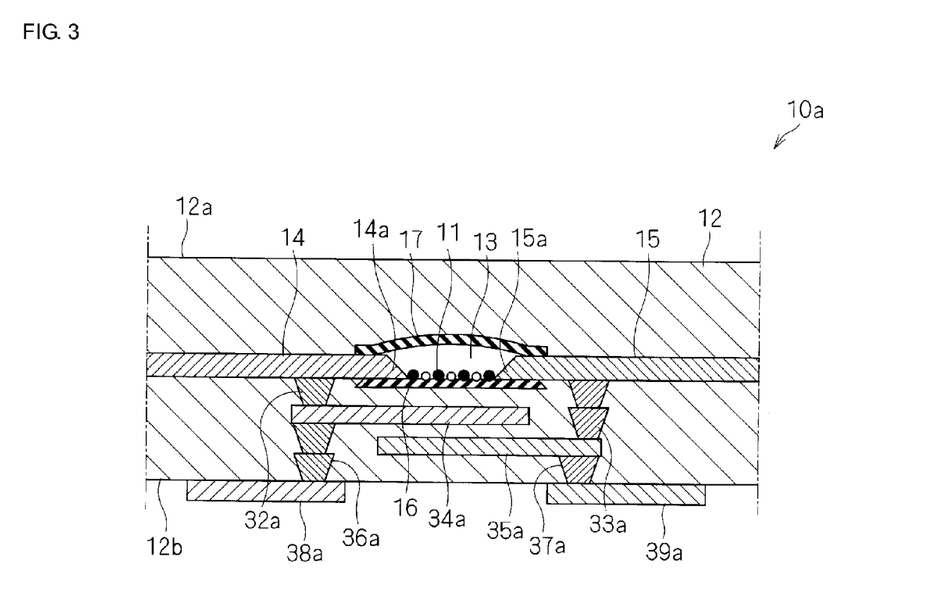
FIG. 3 is an important part cross-sectional view of an ESD protective device (Example 1-2).

FIG. 3 is an important part cross-sectional view of the ESD protective device 10a. As shown in FIG. 3, although the ESD protective device 10a includes, as in Example 1-1, conductor portions 34a and 35a disposed between the ceramic layers of the ceramic multilayer substrate 12, external conductor portions 38a and 39a, and via conductors 32a and 33a; and 36a and 37a, those mentioned above are all disposed at one side of the cavity portion 13, that is, at a side opposite to the cavity portion 13 in the lamination direction with respect to the facing portions 14a and 15a of the discharge electrodes 14 and 15. The conductor portions 34a and 35a are connected to the discharge electrodes 14 and 15 through the via conductors 32a and 33a, respectively, and are connected to the external conductor portions 38a and 39a through the via conductors 36a and 37a, respectively. Since the external conductor portions 38a and 39a are sufficiently apart from each other, no discharge is generated between the external conductor portions 38a and 39a.

In the ESD protective device 10a, since the cavity portion 13 is not provided between the conductor portions 34a and 35a and the facing portions 14a and 15a of the discharge electrodes 14 and 15, the conductor portions 34a and 35a can be disposed closer to the facing portions 14a and 15a of the discharge electrodes 14 and 15, and hence the heat dissipation can be more effectively performed. In addition, the diffusion of the glass component can be more effectively suppressed. Since the conductor portions 34a and 35a are provided at a plurality of positions, the heat dissipation and the diffusion suppression of the glass component can be more reliably performed. Hence, the degradation in discharge characteristics caused by repeatedly performed discharge can be suppressed.

Example 2-1

An ESD protective device 10b of Example 2-1 will be described with reference to FIG. 4.

Figure 4:
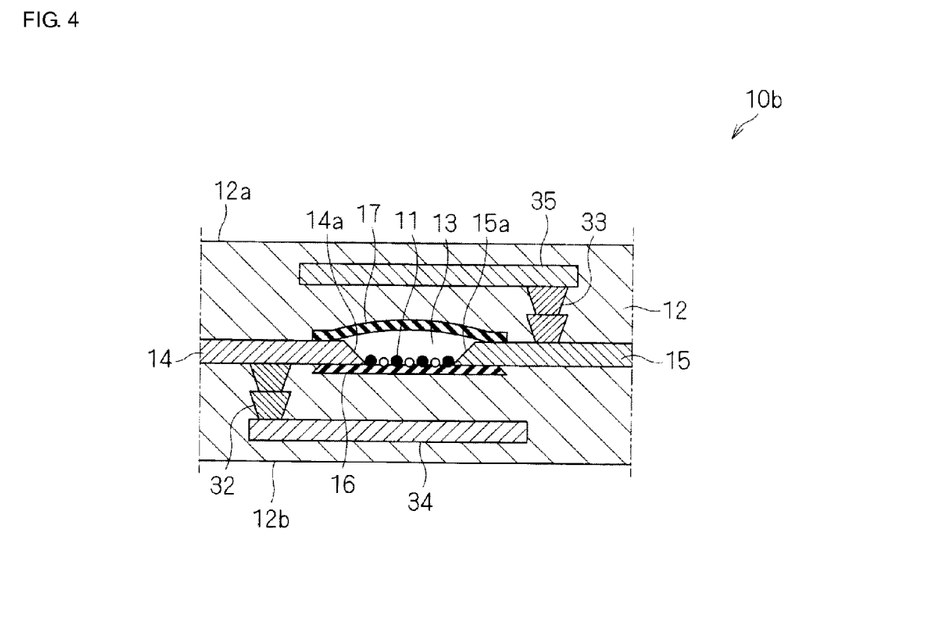
FIG. 4 is an important part cross-sectional view of an ESD protective device (Example 2-1).

FIG. 4 is an important part cross-sectional view of the ESD protective device 10b. As shown in FIG. 4, in the ESD protective device 10a, as in Example 1-1, the conductor portions 34 and 35 disposed between the ceramic layers of the ceramic multilayer substrate 12 are disposed at the two sides in the lamination direction with respect to the facing portions 14a and 15a of the discharge electrodes 14 and 15 and are connected to the discharge electrodes 14 and 15 through the via conductors 32 and 33, respectively. However, the external conductor portions 38 and 39 and the via conductors 36 and 37 shown in Example 1-1 (see FIG. 1) are not provided.

In an ESD protective device 10c, since the conductor portions 34 and 35 are disposed at two primary surface sides of the facing portions 14a and 15a of the discharge electrodes 14 and 15 and are connected to the discharge electrodes 14 and 15, respectively, the heat dissipation and the diffusion suppression of the glass component can be more reliably performed. Hence, the degradation in discharge characteristics caused by repeatedly performed discharge can be suppressed.

Example 2-2

The ESD protective device 10c of Example 2-2 will be described with reference to FIG. 5.

Figure 5:
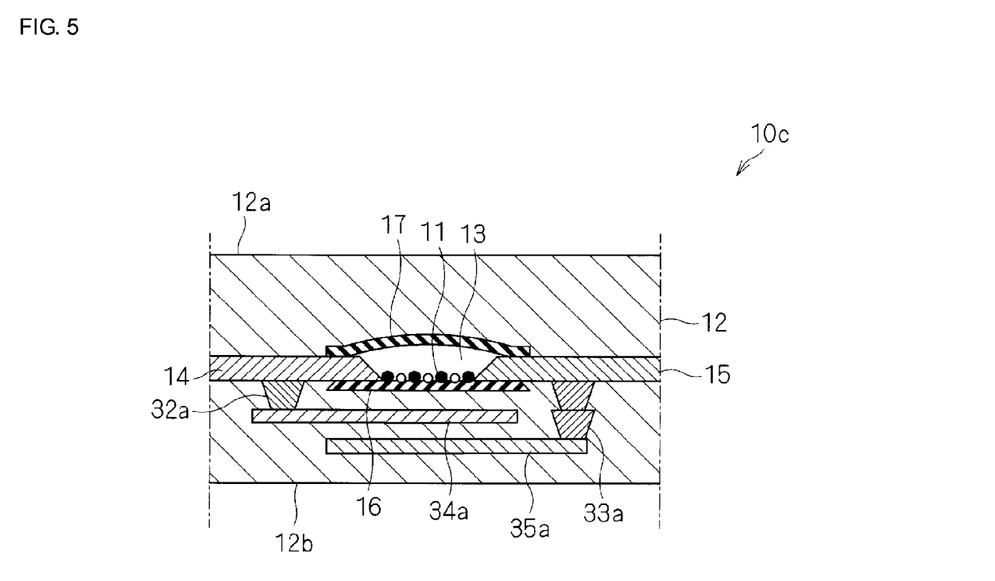
FIG. 5 is an important part cross-sectional view of an ESD protective device (Example 2-2).

FIG. 5 is an important part cross-sectional view of the ESD protective device 10c. As shown in FIG. 5, the ESD protective device 10c includes, as in Example 1-2, the conductor portions 34a and 35a and the via conductors 32a and 33a disposed at one side of the cavity portion 13, that is, at a side opposite to the cavity portion 13 in the lamination direction with respect to the facing portions 14a and 15a of the discharge electrodes 14 and 15. However, the external conductor portions 38a and 39a and the via conductors 36a and 37a connected to the external conductor portions 38a and 39a, respectively, shown in Example 1-2 (see FIG. 3) are not provided.

In the ESD protective device 10c, since the cavity portion 13 is not provided between the conductor portions 34a and 35a and the facing portions 14a and 15a of the discharge electrodes 14 and 15, the conductor portions 34a and 35a can be disposed closer to the facing portions 14a and 15a of the discharge electrodes 14 and 15, and hence, the heat dissipation can be more effectively performed. In addition, the diffusion of the glass component can be more effectively suppressed.

In addition, since the conductor portions 34a and 35a are provided at a plurality of positions, the heat dissipation and the diffusion suppression of the glass component can be more effectively performed. Hence, the degradation in discharge characteristics caused by repeatedly performed discharge can be suppressed.

Example 3-1

An ESD protective device 10d of Example 3-1 will be described with reference to FIG. 6.

Figure 6:
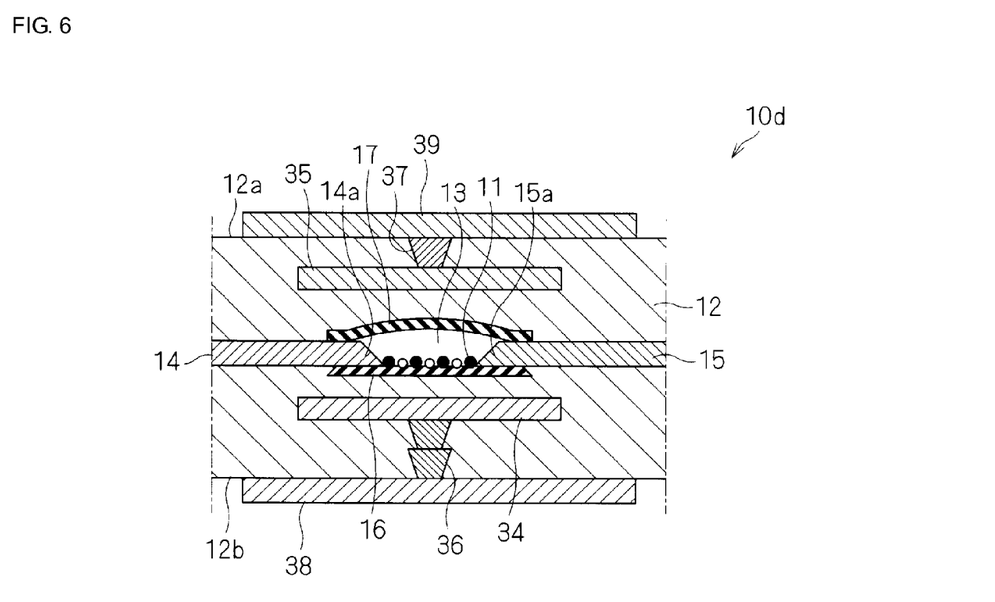
FIG. 6 is an important part cross-sectional view of an ESD protective device (Example 3-1).

FIG. 6 is an important part cross-sectional view of the ESD protective device 10d. As shown in FIG. 6, in the ESD protective device 10d, as in Example 1-1, the conductor portions 34 and 35 are connected to the external conductor portions 38 and 39 through the via conductors 36 and 37, respectively. However, the via conductors 32 and 33 connected to the conductor portions 34 and 35 and the discharge electrodes 14 and 15, respectively, shown in Example 1-1 (see FIG. 1) are not provided.

In the ESD protective device 10d, although the discharge electrodes 14 and 15 are not electrically connected to the conductor portions 34 and 35, the via conductors 36 and 37, and the external conductor portions 38 and 39, the heat dissipation can be performed, and the diffusion of the glass component can be suppressed. Hence, the degradation in discharge characteristics caused by repeatedly performed discharge can be suppressed.

Example 3-2

An ESD protective device 10e of Example 3-2 will be described with reference to FIG. 7.

Figure 7:
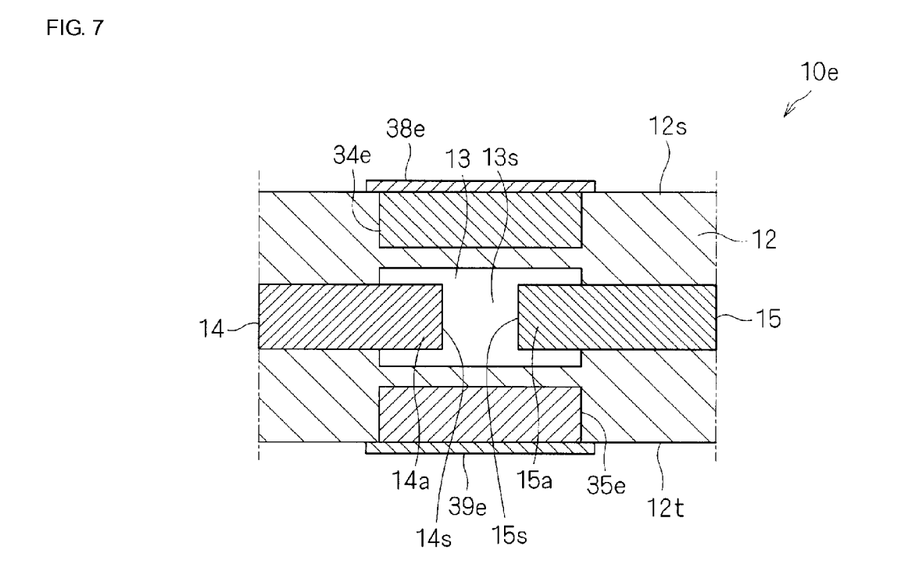
FIG. 7 is an important part cross-sectional view of an ESD protective device (Example 3-2).

FIG. 7 is an important part cross-sectional view of the ESD protective device 10e taken along a position corresponding to the line X-X of FIG. 1. As shown in FIG. 7, in the ESD protective device 10e, between the ceramic layers of the ceramic multilayer substrate 12 in which the discharge electrodes 14 and 15 are disposed, conductor portions 34e and 35e are disposed. The conductor portions 34e and 35e extend to side surfaces 12s and 12t, respectively, of the ceramic multilayer substrate 12 and are connected to external conductor portions 38e and 39e formed on the side surfaces 12s and 12t, respectively, of the ceramic multilayer substrate 12.

When viewed in a direction (top-to-bottom direction in FIG. 7) perpendicular to the lamination direction (direction perpendicular to the plane in FIG. 7) in which the ceramic layers of the ceramic multilayer substrate 12 are laminated and to the facing direction (right-to-left direction in FIG. 7) in which the facing portions 14a and 15a of the discharge electrodes 14 and 15 face each other, the conductor portions 34e and 35e are formed so as to cover the facing front ends 14s and 15s of the facing portions 14a and 15a of the discharge electrodes 14 and 15 and also so as to cover the facing region 13s in which the front ends 14s and 15s of the facing portions 14a and 15a of the discharge electrodes 14 and 15 face each other with the shortest distance provided therebetween.

In the ESD protective device 10e, since the heat generated in discharge is partially dissipated out of the ESD protective device 10e from the conductor portions 34e and 35e through the external conductor portions 38e and 39e, respectively, the increase in temperature of the facing portions 14a and 15a of the discharge electrodes 14 and 15 can be suppressed. In addition, by the conductor portions 34e and 35e, the diffusion of the glass component in firing can be suppressed. Hence, the degradation in discharge characteristics caused by repeatedly performed discharge can be suppressed.

Example 4

An ESD protective device 10f of Example 4 will be described with reference to FIG. 8.

Figure 8:
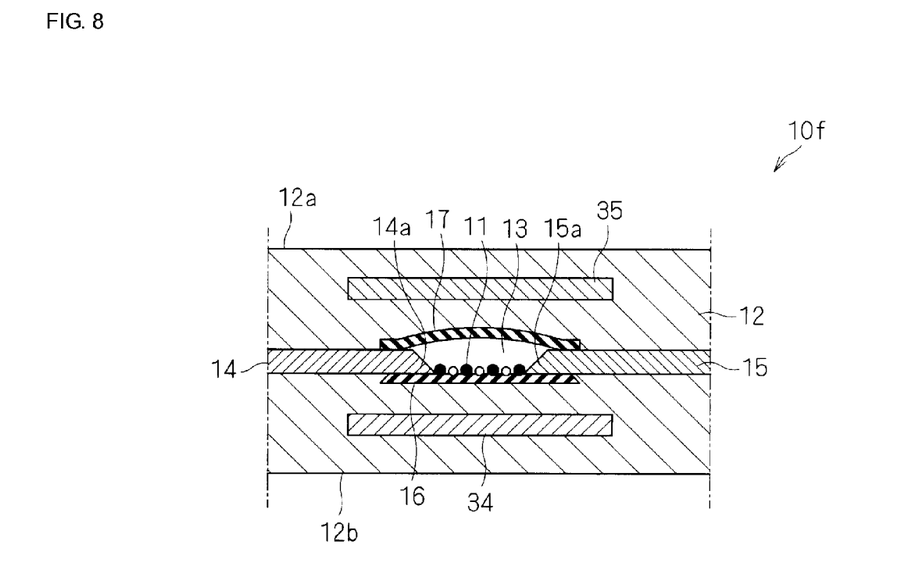
FIG. 8 is an important part cross-sectional view of an ESD protective device (Example 4).

FIG. 8 is an important part cross-sectional view of the ESD protective device 10f. As shown in FIG. 8, in the ESD protective device 10f, as in Example 1-1, the conductor portions 34 and 35 are disposed at the two sides of the cavity portion 13 in the lamination direction, that is, at the two sides in the lamination direction with respect to the facing portions 14a and 15a of the discharge electrodes 14 and 15. However, the external conductor portions 38 and 39 and the via conductors 32 and 33; and 36 and 37 shown in Example 1-1 (see FIG. 1) are not provided.

In the ESD protective device 10f, the heat generated in discharge is partially dissipated from the facing portions 14a and 15a of the discharge electrodes 14 and 15 to the conductor portions 34 and 35. In addition, by the conductor portions 34 and 35, the diffusion of the glass component in firing can be suppressed. Hence, the degradation in discharge characteristics caused by repeatedly performed discharge can be suppressed.

Example 5-1

An ESD protective device 10g of Example 5-1 will be described with reference to FIG. 9.

Figure 9:
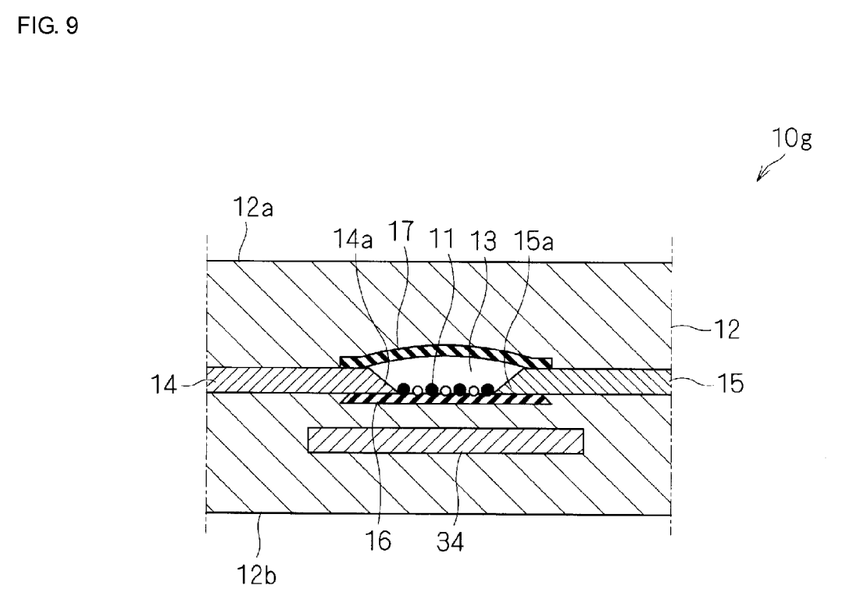
FIG. 9 is an important part cross-sectional view of an ESD protective device (Example 5-1).

FIG. 9 is an important part cross-sectional view of the ESD protective device 10g. As shown in FIG. 9, in the ESD protective device 10g, as in Example 4, the conductor portion 34 is disposed at one side of the cavity portion 13 in the lamination direction, that is, at a side opposite to the cavity portion 13 in the lamination direction with respect to the facing portions 14a and 15a of the discharge electrodes 14 and 15. However, the conductor portion 35 shown in Example 4 (see FIG. 8) is not provided.

In the ESD protective device 10g, since the cavity portion 13 is not provided between the conductor portion 34 and the facing portions 14a and 15a of the discharge electrodes 14 and 15, the conductor portions 34 and 35 and the conductor 34 can be disposed closer to the facing portions 14a and 15a of the discharge electrodes 14 and 15, and hence the heat dissipation can be more effectively performed. In addition, the conductor portion 34 can suppress the diffusion of the glass component in firing. Hence, the degradation in discharge characteristics caused by repeatedly performed discharge can be suppressed.

Example 5-2

An ESD protective device 10h of Example 5-2 will be described with reference to FIG. 10.

Figure 10:
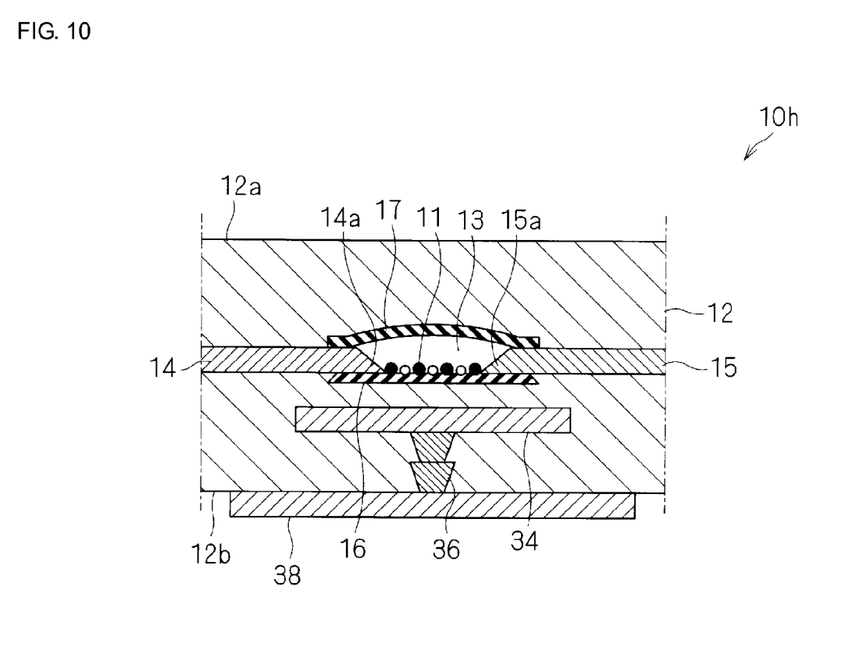
FIG. 10 is an important part cross-sectional view of an ESD protective device (Example 5-2).

FIG. 10 is an important part cross-sectional view of the ESD protective device 10h. As shown in FIG. 10, in the ESD protective device 10h, among the conductor portions 33 and 34, the via conductors 36 and 37, and the external conductor portions 38 and 38 provided in Example 3-1 (see FIG. 6), although the conductor portion 34, the via conductor 36, and the external conductor portion 38 are provided at one side of the cavity portion 13 in the lamination direction, that is, at a side opposite to the cavity portion 13 in the lamination direction with respect to the facing portions 14a and 15a of the discharge electrodes 14 and 15, the conductor portion 35, the via conductor 37, and the external conductor portion 39 disposed at a cavity portion 13 side are not provided.

In the ESD protective device 10h, heat can be dissipated out of the ESD protective device 10h from the conductor portion 34 through the external conductor portion 38. In addition, the conductor portion 34 can suppress the diffusion of the glass component in firing. Hence, the degradation in discharge characteristics caused by repeatedly performed discharge can be suppressed.

Formation Example

A formation example of the ESD protective device of each of the above Examples will be described.

(1) Preparation of Materials

For a ceramic material to be used as a material of the ceramic layers of the ceramic multilayer substrate, materials having compositions primarily containing Ba, Al, and Si are used. The raw materials are blended and mixed together to have a predetermined composition and are then calcined at 800° C. to 1,000° C. The calcined powder thus obtained is pulverized by a zirconia ball mill for 12 hours, so that a ceramic powder is obtained. To this ceramic powder, an organic solvent, such as toluene and/or Ekinen, is added and mixed together. Furthermore, a binder and/or a plasticizer is added, so that a slurry is obtained. The slurry thus obtained is formed into a ceramic green sheet having a thickness of 50 μm by a doctor blade method.

Glass is added in advance to the ceramic raw material powder so that the ceramic multilayer substrate contains a glass component. A ceramic raw material powder which produces glass in firing may also be used.

In addition, an electrode paste forming the discharge electrode is formed. A solvent is added to 80 wt % of a Cu powder having an average grain diameter of approximately 1.5 μm and a binder resin, such as an ethyl cellulose, and the mixture thus obtained is stirred and mixed by rollers, so that the electrode paste is obtained.

A mixed paste forming the discharge auxiliary portion is obtained in such a way that after a Cu powder having an average grain diameter of approximately 3 μm as a metal material and silicon carbide (SiC) having an average grain diameter of 1 μm as a semiconductor material are blended together at a predetermined ratio, a binder resin and a solvent are added, and stirring and mixing are then performed by rollers. The mixed paste is formed to contain 40 wt % of the binder resin and the solvent and, as the balance, 60 wt % of the Cu powder and the silicon carbide.

In addition, a resin paste forming the cavity portion is also formed in a manner similar to that described above. The resin paste is formed of a resin and a solvent. As a resin material, a resin to be decomposed and lost in firing is used. For example, a PET, a polypropylene, an ethyl cellulose, and an acrylic resin may be used.

In addition, a seal layer forming paste forming the seal layer is formed by a method similar to that for the electrode paste. For example, 50 wt % of an $Al_2O_3$ powder having an average grain diameter of approximately 1 μm, and 50 wt % of a solvent and a binder resin, such as an ethyl cellulose, are stirred and mixed together by rollers, so that the seal layer forming paste (alumina paste) is obtained. A solid component of the seal layer forming paste is not particularly limited as long as a material having a sintering temperature higher than that of the ceramic material of the ceramic multilayer substrate is used. For example, alumina, zirconia, magnesia, mullite, or quartz may be selected.

(2) Application of Paste by Screen Printing

After through-holes are formed in the ceramic green sheet using a laser, the electrode paste is filled in the through-holes by screen printing to form portions used as the via conductors. The through-holes may also be formed by using a die.

Next, on a ceramic green sheet to be formed into a ceramic layer adjacent to the discharge electrode, the seal layer forming paste is applied by screen printing, so that a portion to be formed into the seal layer is formed.

Next, in order to form the discharge auxiliary portion, the mixed paste is applied by screen printing on a ceramic green sheet to be formed into another ceramic layer adjacent to the discharge electrode to have a predetermined pattern. For example, when the thickness of the mixed paste is large, a mixed paste containing silicon carbide and a Cu powder may be filled in recess portions provided in advance in the ceramic green sheet.

The electrode paste is applied by screen printing on the ceramic green sheet described above to form the discharge electrodes each having a facing portion. In this formation example, the discharge electrodes are formed so that the width thereof is 100 μm and a discharge gap width (dimension of the space between the facing front ends of the facing portions) is 30 μm.

Furthermore, on the ceramic green sheet described above, in order to form the cavity portion, the resin paste is applied by screen printing.

In addition, on a ceramic green sheet to be formed into one ceramic layer adjacent to the conductor portion or the external conductor portion, the electrode paste is applied by screen printing, so that the conductor portion or the external conductor portion is formed. The conductor portion or the external conductor portion may also be formed using metal foil.

Although the manufacturing process may be simplified when the conductor portion and the external conductor portion are formed using the electrode paste, another metal, such as Al, Au, or Ni, may also be used. In view of the heat dissipation, an excellent effect may be obtained when Ag having a high thermal conductivity is used.

In order to improve the heat dissipation and to suppress the diffusion of glass, the conductor portion and the external conductor portion preferably have a large thickness and a high compactness. When the conductor portion and/or the external conductor portion is formed using a conductive paste, if the filling property of a metal powder contained in the conductive paste is increased by increasing the degree of sphericity of the metal powder, broadening the grain distribution thereof, or decreasing the resin ratio, the compactness of the conductor portion and/or the external conductor portion can be increased. In addition, when the solid component ratio of the conductive paste is increased, or a print thickness of a printing pattern is increased, the thickness can be further increased. When the conductor portion and/or the external conductor portion is formed using metal foil, the thickness of the metal foil may be simply increased.

(3) Lamination and Pressure-Bonding

As in a normal ceramic multilayer substrate, the ceramic green sheets are laminated and pressure-bonded to each other. In the formation example, the lamination is performed so that the thickness is 0.3 mm and the facing portions of the discharge electrodes and the cavity portion are disposed at the center in the thickness direction.

(4) Cutting and Application of End-Surface Electrodes

As in a chip-type electronic component such as an LC filter, cutting is performed using a micro-cutter into individual chips. In the formation example, cutting is performed to have chips each having a size of 1.0 mm by 0.5 mm. Subsequently, the electrode paste is applied to the end surfaces, so that the external electrodes are formed.

(5) Firing

Next, as in a normal ceramic multilayer substrate, firing is performed in a $N_2$ atmosphere. When a noble gas, such as Ar or Ne, is introduced into the cavity portion to decrease a response voltage to the ESD, in a noble gas atmosphere containing Ar, Ne, or the like, firing may be performed in a temperature region in which the ceramic material is contracted and sintered. In the case of an electrode material (such as Ag) which is not oxidized, firing may be performed in an air atmosphere.

By the firing, the resin paste is lost, so that the cavity portion is formed. In addition, by the firing, the organic solvent in the ceramic green sheet, and the binder resin and the solvent in the mixed paste are also lost.

(6) Plating

As in a chip-type electronic component such as an LC filter, electrolytic Ni—Sn plating is performed on the external electrodes.

As described above, the ESD protective device is completed.

In addition, the semiconductor material in the mixed paste is not limited to the materials mentioned above. For example, there may be used a metal semiconductor, such as silicon or germanium; a carbide, such as silicon carbide, titanium carbide, zirconium carbide, molybdenum carbide, or tungsten carbide; a nitride, such as titanium nitride, zirconium nitride, chromium nitride, vanadium nitride, or tantalum nitride; a silicide, such as titanium silicide, zirconium silicide, tungsten silicide, molybdenum silicide, chromium silicide, or chromium silicide; a boride, such as titanium boride, zirconium boride, chromium boride, lantern boride, molybdenum boride, or tungsten boride; or an oxide, such as zinc oxide or strontium titanate. In particular, since the price is relatively inexpensive, and many types of materials having various grain diameters are commercially available, silicon or silicon carbide is specifically preferable. Those semiconductor materials may be used alone, or at least two types thereof may be used in combination. In addition, the semiconductor material may be appropriately used in combination with a resistive material, such as alumina or a BAS material.

The metal material in the mixed paste is not particularly limited to the materials mentioned above. For example, Cu, Ag, Pd, Pt, Al, Ni, W, Mo, an alloy thereof, or a combination therebetween may also be used.

In addition, although the resin paste is applied to form the cavity portion, instead of using a resin, any material, such as carbon, may also be used as long as being lost by firing. Alternatively, without performing the formation of a paste and the application thereof, for example, a resin film may be disposed at a predetermined position by adhesion.

In addition, in this formation example, although the method is shown in which cutting is performed before the firing to form separated individual chips, a method may also be used in which after ceramic green sheets formed in an assembly state are laminated and pressure-bonded to each other to form a laminate, dividing grooves are formed in the laminate thus formed, and after the firing and the plating are performed, cutting of the laminate is performed into individual chips.

Evaluation was performed for the formation example of each of the above Examples in which the ESD protective device was formed by the steps described above. As a Comparative Example, an ESD protective device including no conductor portions, external conductor portions, and via conductors was formed.

An ESD discharge response of each sample was evaluated. The ESD discharge response was evaluated in accordance with an electrostatic discharge immunity test defined by IEC61000-4-2 of the IEC standard. By contact discharge, 8 kV was applied, and the peak voltage in discharge was detected at a protective circuit side.

Furthermore, an ESD repeated resistance was evaluated. After 8 kV was applied 100 times by contact discharge, the discharge response to the ESD was evaluated.

The comprehensive judgment was performed based on the ESD repeated resistance, and a peak voltage of 700 V or more detected at the protective circuit side was ranked as NG (x), a peak voltage of 600 V to less than 700 V was ranked as good (○), and a peak voltage of less than 600 V was ranked as excellent (⊙).

The evaluation results are shown in the following Table 1.

TABLE 1

Table of Evaluation Results

| | ESD Discharge Response | ESD Repeated Resistance | Comprehensive Judgment |
|---|---|---|---|
| Example 1-1 | 467 | 546 | ⊙ |
| Example 1-2 | 473 | 563 | ⊙ |
| Example 2-1 | 469 | 551 | ⊙ |
| Example 2-2 | 476 | 568 | ⊙ |
| Example 3-1 | 468 | 581 | ⊙ |
| Example 3-2 | 479 | 661 | ○ |
| Example 4 | 471 | 606 | ○ |
| Example 5-1 | 477 | 621 | ○ |
| Example 5-2 | 474 | 592 | ⊙ |
| Comparative Example | 481 | 781 | X |

In addition, the units of the values in "ESD Discharge Response" and "ESD Repeated Resistance" each indicate V.

From Table 1, it is found that the initial ESD discharge response of each Example is improved. The reason for this is believed that since at least one heat dissipation conductor portion (electrode) is disposed around the facing portions of discharge electrode portions, the glass diffusion from the ceramic toward the facing portions of the discharge electrodes is inhibited. Accordingly, it is believed that since the same effect is obtained as that obtained when initial sintering of the discharge electrodes is suppressed, the ball forming phenomenon of the front ends of the facing portions of the discharge electrodes is suppressed, and as a result, the gap between the facing portions of the discharge electrodes at the initial stage is stabilized.

From Table 1, it is found that the ESD repeated resistance is improved when the heat dissipation is high.

For example, between the case in which the conductor portion is electrically connected to the discharge electrode and the case in which the conductor portion is not electrically connected to the discharge electrode, the ESD repeated resistance of the former having high heat dissipation is improved as compared to that of the latter. This improvement can be confirmed by comparison between Example 1-1 (FIG. 1) and Example 3-1 (FIG. 6) and comparison between Example 2-1 (FIG. 4) and Example 4 (8).

Between the case in which the conductor portion is electrically connected to the external conductor portion and the case in which the conductor portion is not electrically connected to the external conductor portion, the ESD repeated resistance of the former having high heat dissipation is improved as compared to that of the latter. This improvement can be confirmed by comparison between Example 1-1 (FIG. 1) and Example 2-1 (FIG. 4) and comparison between Example 1-2 (FIG. 3) and Example 2-2 (FIG. 5).

Between the case in which the conductor portions are disposed at the two sides in the lamination direction with respect to the facing portions of the discharge electrodes and the case in which the conductor portion is disposed only at one side opposite to the cavity portion in the lamination direction with respect to the facing portions of the discharge electrodes, the ESD repeated resistance of the former having high heat dissipation is improved as compared to that of the latter. This improvement can be confirmed by comparison between Example 3-1 (FIG. 6) and Example 5-2 (FIG. 10) and comparison between Example 4 (FIG. 8) and Example 5-(FIG. 9).

Between the case in which the conductor portion is disposed between ceramic layers different from those for the discharge electrodes and the case in which the conductor portion is disposed between the same ceramic layers as those for the discharge electrodes, the ESD repeated resistance of the former is improved as compared to that of the latter. This improvement can be confirmed by comparison between Example 3-2 and the other examples.

That is, when "the heat dissipation conductor portion is connected to the discharge electrode", "the heat dissipation conductor portion is connected to the external conductor portion", "the heat dissipation conductor portions are disposed to sandwich the facing portions of the discharge electrodes from the two sides", or "the heat dissipation conductor portion is not disposed in a lateral direction between the same layers as those for the facing portions of the discharge electrodes but are disposed in the lamination direction so as to cover the facing portions of the discharge electrodes", the heat dissipation effect is enhanced, and the ESD repeated resistance is improved.

CONCLUSION

As has thus been described, when the conductor portion which faces the facing portions of the discharge electrodes is provided, the degradation in discharge characteristics caused by repeatedly performed discharge can be suppressed.

In addition, the present invention is not limited to the embodiments described above and may be variously changed and modified.

For example, the main body of the ESD protective device is not limited to the ceramic multilayer substrate, and an insulating multilayer substrate prepared by laminating insulating layers formed from a resin or the like may also be used.

The conductor portion may be formed so that the width covering one facing portion of the discharge electrode is different from the width covering the other facing portion of the other discharge electrode. For example, since the facing portion of the discharge electrode which receives electron in discharge generates heat, in order to promote the heat dissipation, when the conductor portion is formed so that the width covering the facing portion of the discharge electrode which receives electrons in discharge is larger than the width covering the other facing portion of the other discharge electrode, the degradation in discharge characteristics can be more reliably suppressed.

When the facing portions and the cavity portion are disposed to the discharge electrodes not at the center but at one side in the lamination direction, an effect can be enhanced if the conductor portions are collectively disposed to the discharge electrodes at a side at which the number of the ceramic layers of the ceramic multilayer substrate is relatively large with respect to the facing portions. In this case, the cavity portion is preferably disposed to the discharge electrodes at a side opposite to the conductor portions, that is, at a side at which the number of the ceramic layers of the ceramic multilayer substrate is relatively small with respect to the facing portions.

10, 10a to 10h protective device
11 discharge auxiliary portion
12 ceramic multilayer substrate
12a upper surface
12b lower surface
12p, 12q end surface (surface)
12s, 12t side surface
13 cavity portion
13s facing region
14 discharge electrode
14a facing portion
14s front end
15 discharge electrode
15a facing portion
15s front end
15 conductor portion
16, 17 seal layer
18, 19 external electrode
32, 32a via conductor
33, 33a via conductor
33, 34 conductor portion
34 conductor portion
34, 35 conductor portion
34a, 35a conductor portion
34e, 35e conductor portion
35 conductor portion
36 via conductor
36, 36a via conductor
37, 37a via conductor
38, 38a, 38e external conductor portion
39, 39a, 39e external conductor portion

The invention claimed is:
1. An ESD protective device comprising:
an insulating multilayer substrate including a plurality of insulating layers laminated to each other;
a cavity portion formed inside the insulating multilayer substrate;
at least one pair of discharge electrodes having facing portions which are formed on a surface of the insulating multilayer substrate defining the cavity portion and which face each other with a space provided there between;

external electrodes which are formed on surfaces of the insulating multilayer substrate and which are connected to the discharge electrodes; and at least one conductor portion which is formed inside the ceramic multilayer substrate other than the cavity portion and covers an entire area of a facing region in which the front ends of the facing portions of the discharge electrodes face each other when viewed in a lamination direction in which the insulating layers of the insulating multilayer substrate are laminated, in a facing direction in which the facing portions of the discharge electrodes face each other, or in a direction perpendicular both to the lamination direction and the facing direction.

2. The ESD protective device according to claim 1, wherein the conductor portion is formed so as to cover at least one of the facing front ends of the facing portions of the discharge electrodes when viewed in the lamination direction, and at least one of the insulating layers of the insulating multilayer substrate is disposed between the conductor portion and the facing portions of the discharge electrodes.

3. The ESD protective device according to claim 1, wherein the insulating multilayer substrate is a ceramic multilayer substrate containing a glass component.

4. The ESD protective device according to claim 1, further comprising a discharge auxiliary portion which is formed in a facing region in which the front ends of the facing portions of the discharge electrodes face each other with the shortest distance provided there between and which contains dispersed metal material and semiconductor material, wherein the conductor portion is formed so as to cover the facing region when viewed in the lamination direction.

5. The ESD protective device according to claim 1, wherein the conductor portion is disposed, with respect to the facing portions of the discharge electrodes, in the lamination direction and at a side opposite to the cavity portion.

6. The ESD protective device according to claim 1, wherein the conductor portions are disposed at a plurality of different positions located between the insulating layers of the insulating multilayer substrate.

7. The ESD protective device according to claim 6, wherein the conductor portions are disposed at two sides in the lamination direction with respect to the facing portions of the discharge electrodes.

8. The ESD protective device according to claim 1, wherein the conductor portion is electrically connected to at least one of the discharge electrodes.

9. The ESD protective device according to claim 1, further comprising an external conductor portion on a surface of the insulating multilayer substrate, wherein the conductor portion and the external conductor portion are electrically connected to each other.

10. The ESD protective device according to claim 1, further comprising a seal layer which is disposed between the facing portions of the discharge electrodes and the insulating layers of the insulating multilayer substrate and which suppresses a component contained in the insulating layers of the insulating multilayer substrate from passing there through.

11. The ESD protective device according to claim 1, wherein at least one pair of conductor portions facing each other are disposed at a one side in the lamination direction with respect to the facing portions of the discharge electrodes, and are connected to different external electrodes.

12. An ESD protective device comprising:

an insulating multilayer substrate including a plurality of insulating layers laminated to each other;

a cavity portion formed inside the insulating multilayer substrate;

at least one pair of discharge electrodes having facing portions which are formed on a surface of the insulating multilayer substrate defining the cavity portion and which face each other with a space provided there between;

external electrodes which are formed on surfaces of the insulating multilayer substrate and which are connected to the discharge electrodes; and at least one conductor portion which is formed inside the ceramic multilayer substrate so as to cover at least one of facing front ends of the facing portions of the discharge electrodes when viewed in a lamination direction in which the insulating layers of the insulating multilayer substrate are laminated, in a facing direction in which the facing portions of the discharge electrodes face each other, or in a direction perpendicular both to the lamination direction and the facing direction, a discharge auxiliary portion which is formed in a facing region in which the front ends of the facing portions of the discharge electrodes face each other with the shortest distance provided there between and which contains dispersed metal material and semiconductor material, wherein the conductor portion is formed so as to cover the facing region when viewed in the lamination direction.

* * * * *

UNITED STATES PATENT AND TRADEMARK OFFICE
CERTIFICATE OF CORRECTION

PATENT NO.        : 9,590,417 B2
APPLICATION NO.   : 14/267483
DATED             : March 7, 2017
INVENTOR(S)       : Yoshihito Otsubo Page 1 of 1

It is certified that error appears in the above-identified patent and that said Letters Patent is hereby corrected as shown below:

In the Specification

Column 15, Line 35, "5-(Fig. 9)" should read -- 5-1 (Fig. 9) --.

Signed and Sealed this
First Day of August, 2017

Joseph Matal
*Performing the Functions and Duties of the*
*Under Secretary of Commerce for Intellectual Property and*
*Director of the United States Patent and Trademark Office*